US009589526B2

(12) United States Patent
Shin

(10) Patent No.: US 9,589,526 B2
(45) Date of Patent: Mar. 7, 2017

(54) PIXELS WITH DIFFERENT COMPENSATION PERIODS AND DISPLAY DEVICE USING THE SAME

(71) Applicant: SAMSUNG DISPLAY CO., LTD., Yongin, Gyeonggi-Do (KR)

(72) Inventor: Kwang-Sub Shin, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 348 days.

(21) Appl. No.: 14/254,115

(22) Filed: Apr. 16, 2014

(65) Prior Publication Data

US 2014/0354621 A1 Dec. 4, 2014

(30) Foreign Application Priority Data

May 28, 2013 (KR) ........................ 10-2013-0060519

(51) Int. Cl.
*H01L 27/32* (2006.01)
*G09G 3/36* (2006.01)
*G09G 3/32* (2016.01)

(52) U.S. Cl.
CPC ......... *G09G 3/3696* (2013.01); *G09G 3/3233* (2013.01); *G09G 2300/0443* (2013.01); *G09G 2300/0861* (2013.01); *G09G 2320/0233* (2013.01); *G09G 2320/045* (2013.01)

(58) Field of Classification Search
CPC ... G09G 2300/0443; G09G 2300/0861; G09G 2320/0233; G09G 2320/045; G09G 3/3233; G09G 3/3696
See application file for complete search history.

(56) References Cited

U.S. PATENT DOCUMENTS

2008/0111777 A1* 5/2008 Kim ..................... G09G 3/3233 345/83
2010/0109540 A1* 5/2010 Kim ..................... G09G 3/3225 315/210
2010/0141644 A1* 6/2010 Lee ...................... G09G 3/3233 345/214
2011/0109612 A1* 5/2011 Chaji .................. G09G 3/3283 345/211
2014/0146027 A1* 5/2014 Tsuge .................. G09G 3/3233 345/208

FOREIGN PATENT DOCUMENTS

KR 10-2005-0052306 A 6/2005
KR 10-2009-0013985 A 2/2009
KR 10-2009-0055476 A 6/2009
KR 10-2012-0044503 A 5/2012

* cited by examiner

*Primary Examiner* — Lun-Yi Lao
*Assistant Examiner* — Elliott Deaderick
(74) *Attorney, Agent, or Firm* — Lee & Morse, P.C.

(57) ABSTRACT

A pixel for a display device includes a first pixel area, a second pixel area, and a switching transistor coupled between a data line and the first and second pixel areas. The first pixel area includes a first threshold compensation point and the second pixel area includes a second threshold compensation point. The first threshold compensation point has a turn-on period different from a turn-on period of the second threshold compensation point, and at least one of the first pixel area or the second pixel area includes an organic light emitting diode.

19 Claims, 6 Drawing Sheets

PIXELS WITH DIFFERENT COMPENSATION PERIODS AND DISPLAY DEVICE USING THE SAME

CROSS-REFERENCE TO RELATED APPLICATION

Korean Patent Application No. 10-2013-0060519, filed on May 28, 2013, in the Korean Intellectual Property Office, and entitled, "Pixel and Display Device Using the Same," is incorporated by reference herein in its entirety.

BACKGROUND

1. Field

Embodiments relate to a pixel and a display device using the same.

2. Description of the Related Art

Flat panel displays come in many types and varieties. Examples include liquid crystal displays (LCDs), field emission display (FEDs), plasma display panel (PDPs), and organic light emitting display (OLEDs).

An OLED displays an image using an organic light emitting diode that generates light based on a recombination of electrons and holes in an active layer. OLEDs have rapid response speed and are able to be driven with low power consumption.

SUMMARY

In accordance with one embodiment, a pixel includes a switching transistor turned on by a scan signal and transmitting a data voltage according to an applied image data signal through a data line, a storage capacitor storing the data voltage, and first and second pixel areas commonly connected to the switching transistor to emit light with a driving current according to the data voltage. Each of the first and second pixel areas may include an organic light emitting diode to emit light, a first transistor to generate and transmit a driving current according to the data voltage through a path that reaches a second power source from a first power source via the organic light emitting diode, a second transistor to diode-connect a gate electrode and a drain electrode of the first transistor, and a compensation capacitor connected between the gate electrode of the first transistor and the switching transistor, the compensation capacitor to maintain a voltage corresponding to a threshold voltage of the first transistor for a predetermined period.

A turn-on period of the second transistor of the first pixel area may be different from a turn-on period of the second transistor of the second pixel area.

Each of the first pixel area and the second pixel area may further include a third transistor provided in the path that reaches the corresponding organic light emitting diode from the first power source, the third transistor to control light emission of the corresponding organic light emitting diode by controlling flow of the driving current that depends on the data voltage.

The first pixel area may control a light emission operation by controlling a power voltage supply of the first power source and the second power source supplied to the first pixel area, and the second pixel area may control a light emission operation by controlling the power voltage supply of the first power source and the second power source supplied to the second pixel area.

When a gray scale value of the image data signal is included in a predetermined low gray area, an image may be displayed by driving one of the first pixel area or the second pixel area having a longer turn-on period of the second transistor.

In accordance with another embodiment, a display device includes a display unit including a plurality of pixels to display an image according to an image data signal, a scan driver to generate corresponding scan signals and sequentially transmit the scan signals through a plurality of scan lines respectively connected to the plurality of pixels, a data driver to transmit a data voltage according to the corresponding image data signal through a plurality of data lines respectively connected to the plurality of pixels, a first gate driver to generate a first threshold voltage control signal and a second threshold voltage control signal corresponding to each of the plurality of pixels, and to transmit the first and second threshold voltage control signals to the plurality of pixels respectively through a first plurality of gate lines and a plurality of second gate lines respectively connected to the pixels, a controller to transmit the image data signal to the data driver and to generate and transmit a plurality of driving control signals for controlling operation of the scan driver, the data driver, and the first gate driver. Each of the plurality of pixels may include a first pixel area to receive the first threshold voltage control signal from the first gate line, and a second pixel area to receive the second threshold voltage control signal from the second gate line, at least one of the first or second pixel areas to emit light with a driving current according to the data voltage.

The display device may further include a second gate driver to generate and transmit first light emission control signals through a plurality of third gate lines and second light emission control signals through a plurality of fourth gate lines, respectively, connected to the plurality of pixels.

The first pixel area may be to receive the first light emission control signal from the third gate line, and the second pixel area may be to receive the second light emission control signal from the fourth gate line. Light emission of the first pixel area and the second pixel area may be controlled corresponding to the first light emission control signal and the second light emission control signal.

Each of the plurality of pixels may include a switching transistor to receive the corresponding scan signal and transmitting a data voltage that depends on the corresponding image data signal, and a storage capacitor to store the data voltage for a predetermined period. The first and second pixel areas may be commonly connected to the switching transistor. Each of the first and second pixel areas may include an organic light emitting diode to emit light, a driving transistor to generate a driving current according to the data voltage and to transmit the driving current to the organic light emitting diode, a compensation transistor to diode-connect a gate electrode and a drain electrode of the driving transistor to compensate a threshold voltage of the driving transistor, and a compensation capacitor to maintain a voltage corresponding to the threshold voltage of the driving transistor for a predetermined period.

Each of the first pixel area and the second pixel area may further include a light emission control transistor to control light emission by controlling flow of the driving current transmitted to the organic light emitting diode from the driving transistor.

A turn-on period of the compensation transistor of the first pixel area may be different from a turn-on period of the compensation transistor of the second pixel area.

When a gray scale value of the image data signal is included in a predetermined low gray area, the first or second pixel area having a longer turn-on period of the compensation transistor may be driven to display an image.

The first threshold voltage control signal and the second threshold voltage control signal may be transmitted as a gate-on voltage level at substantially a same time, and a period during which the first threshold voltage control signal is transmitted as the gate-on voltage level is different from a period during which the second threshold voltage control signal may be transmitted as the gate-on voltage level.

The controller may control light emission of each of the first pixel area and the second pixel area by controlling a driving power source voltage supplied to the first pixel area and a driving power source voltage supplied to the second pixel area.

In accordance with another embodiment, a pixel for a display device includes a first pixel area to control light emission, a second pixel area to control light emission, and a switching transistor coupled between a data line and the first and second pixel areas. The first pixel area may include a first threshold compensation point and the second pixel area may include a second threshold compensation point different from the first threshold compensation point. The first threshold compensation point may have a turn-on period different from a turn-on period of the second threshold compensation point, and at least one of the first pixel area or the second pixel area may include an organic light emitting diode.

The first pixel area may control emission of light during a time when the second pixel area is deactivated.

The first pixel area may be to emit light based on a first threshold voltage control signal, and the second pixel area may be to emit light based on a second threshold voltage control signal.

The first pixel area may include a first organic light emitting diode, and the second pixel area may include a second organic light emitting diode.

The first organic light emitting diode may be to emit light based on a first light emission control signal, and the second organic light emitting diode may be to emit light based on a second light emission control signal. The first organic light emitting diode may emit light during a first state in which the second organic light emitting diode does not emit light, and the first and second organic light emitting diodes may emit light during a second state, the first state corresponding to a first range of gray scale values and the second state corresponding to a second range of gray scale values.

The first pixel area and the second pixel area may commonly use one organic light emitting diode.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
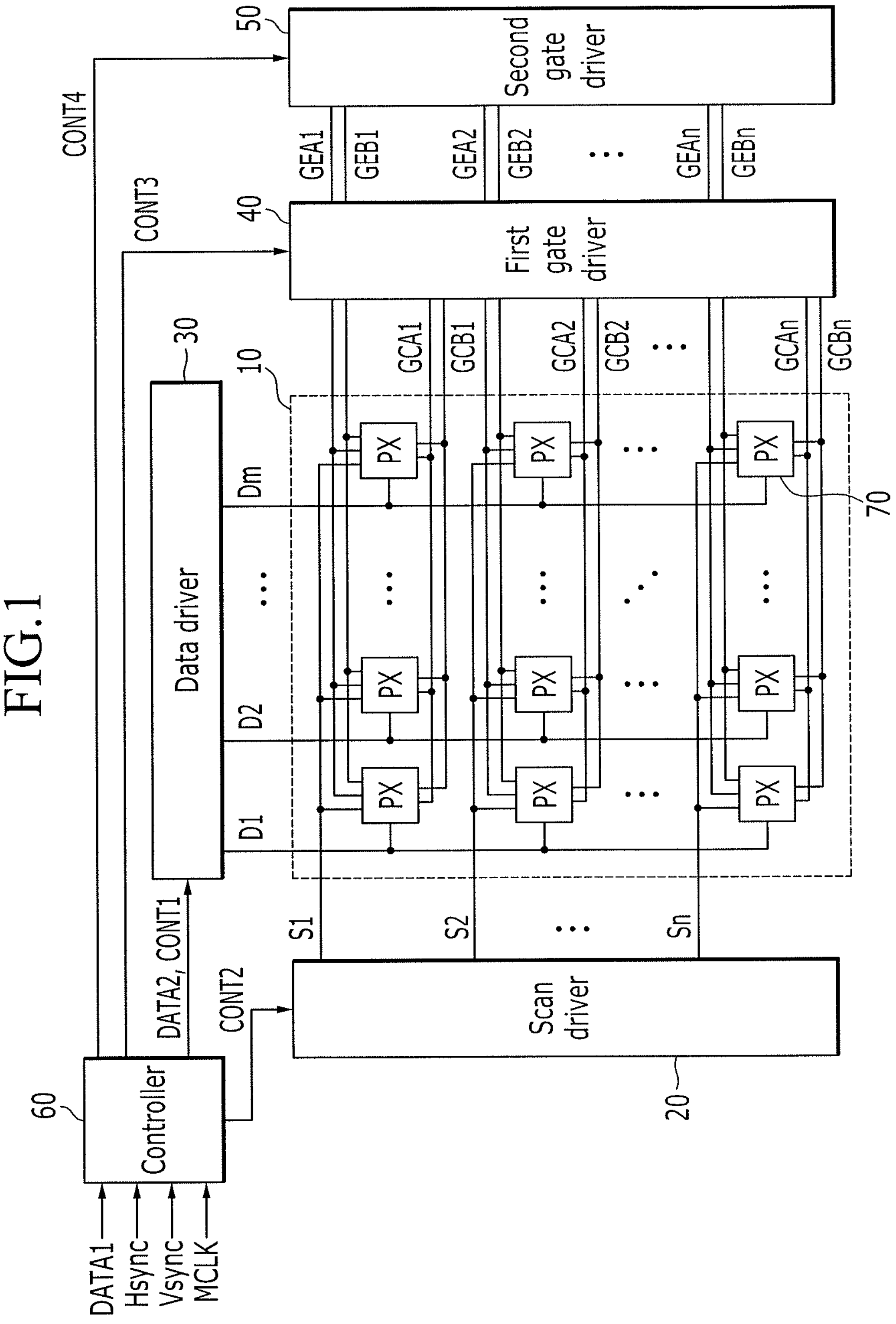
FIG. 1 illustrates an embodiment of a display device.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being “on” another layer or substrate, it can be directly on the other layer or substrate, or intervening layers may also be present. Further, it will be understood that when a layer is referred to as being “under” another layer, it can be directly under, and one or more intervening layers may also be present. In addition, it will also be understood that when a layer is referred to as being “between” two layers, it can be the only layer between the two layers, or one or more intervening layers may also be present. Like reference numerals refer to like elements throughout.

Throughout this specification and the claims that follow, when it is described that an element is “coupled” to another element, the element may be “directly coupled” to the other element or “electrically coupled” to the other element through a third element. In addition, unless explicitly described to the contrary, the word “comprise” and variations such as “comprises” or “comprising”, will be understood to imply the inclusion of stated elements but not the exclusion of any other elements.

FIG. 1 illustrates an embodiment of a display device which includes a display unit 10 including a plurality of pixels 70, a scan driver 20, a data driver 30, a first gate driver 40, a second gate driver 50, and a controller 60.

Each of the plurality of pixels 70 is connected with scan lines S1 to Sn connected to the scan driver 20, data lines D1 to Dm connected with the data driver 30, first gate lines GCA1, GCB1 to GCAn, and GCBn connected with the first gate driver 40, and second gate lines GEA1, GEB1 to GEAn, and GCEn connected with the second gate driver 50.

The scan lines S1 to Sn extend in a row direction in each pixel of the display unit, and transmit a scan signal to the corresponding pixel among the plurality of pixels.

The data lines D1 to Dm extend in a column direction in each pixel of the display unit, and transmit a data voltage according to an image data signal DATA2 to the corresponding pixel among the plurality of pixels.

The first gate line GCA1, GCB1 to GCAn, and GCB extend in the row direction in each pixel of the display unit. Each pixel is connected with a respective pair of first gate lines. Each pair of first gate lines connected to each pixel are respectively referred to as a first threshold voltage control line and a second threshold voltage control line. Thus, as shown in FIG. 1, each pixel included in the first pixel line is connected with the first of the first threshold voltage control lines GCA1 and the first of the second threshold voltage control lines GCB1.

The plurality of first threshold voltage control lines GCA1 to GCAn, which are respectively connected to the plurality of pixels of the display unit, transmit first threshold voltage control signals to the respective pixels. The plurality of second threshold voltage control lines GCB1 to GCBn, which are connected to the plurality of pixels of the display unit transmit second threshold voltage control signals, to the respective pixels.

The second gate lines GEA1, GEB1 to GEAn, and GCEn extend in the row direction of the respective pixels of the display unit. Each pixel is connected with a respective pair of second gate lines. Each pair of second gate lines connected to each pixel will be referred to as a first light emission control line and a second light emission control line. Thus, as shown in FIG. 1, each pixel included in the first pixel line is connected with the first of the first light emission control lines GEA1 and the first of the second light emission control lines GEB1.

The plurality of first light emission control lines GEA1 to GEAn connected to the plurality of pixels of the display unit transmit the first light emission control signal to each pixel. The plurality of second light emission control lines GEB1 to GEBn connected to the plurality of pixels of the display unit transmit the second light emission control signal to each pixel.

The scan driver 20 generates and transmits a scan signal to each pixel through the scan lines S1 to Sn.

The data driver 30 receives an image data signal DATA2 corresponding to an external video signal DATA1 and provides the image data signal DATA2 to each pixel through the data lines D1 to Dm.

The first gate driver 40 generates a plurality of first threshold voltage control signals and a plurality of second threshold voltage control signals, and transmits the first and second threshold voltage control signals to the plurality of pixels, respectively through the plurality of first gate lines.

The second gate driver 50 generates a plurality of first light emission control signals and a plurality of second light emission control signals, and transmits the first and second light emission control signals to the plurality of pixels, respectively, through the plurality of second gate lines.

The controller 60 receives the externally transmitted image signal DATA1 and an input control signal controlling displaying of the image signal DATA1. The image data DATA1 contains luminance data of each pixel of the display unit 100. Luminance may be classified into a predetermined number of gray scale values, for example, 1024 ($=2^{10}$), 256 ($=2^8$), or 64 ($=2^6$) gray scale values. The controller 60 receives the external image signal DATA1 and generates the image data signal DATA2 by performing a signal processing process according to a compensation algorithm, such as luminance, a color, and the like, so as to be applicable to the display device. The image data signal DATA2 is transmitted to the data driver 30.

Referring to FIG. 1, the input control signal transmitted to the controller 60 includes, for example, a vertical synchronization signal Vsync, a horizontal synchronization signal Hsync, and a main clock MCLK. The input control signal is irrelevant to the technical characteristic and may be described with a known driving technique.

The controller 60 generates a plurality of driving control signals that control operation of each driver, and transmits the driving control signal to each driver for realization of an image in the display device. More specifically, the plurality of driving control signals include a data driving control signal CONT1, scan driving control signal CONT2, a first gate driving control signal CONT3, and a second gate driving control signal CONT4.

The data driving control signal CONT1 is transmitted to the data driver 30 for the data driver 30 to generate and transmit a data voltage according to the image data signal DATA2 for every plurality of frames.

The scan driving control signal CONT2 is transmitted to scan driver 20. The scan driver 20 responds by generating a plurality of scan signals and transmits a corresponding scan signal to each pixel through a respective scan line connected to the corresponding pixel, among the plurality of pixels included in each pixel line of the display unit. The scan driving control signal CONT2 may control the plurality of scan signals, for example, to be sequentially transmitted with a predetermined time gap through the scan lines connected to the respective pixel line according to the horizontal synchronization signal Hsync.

The first gate driving control signal CONT3 is transmitted to the first gate driver 40. The first gate driver 40 responds by transmitting the plurality of first threshold voltage control signals and the plurality of second threshold voltage control signals through the plurality of first gate control lines.

The second gate driving control signal CONT4 is transmitted to the second gate driver 50. The second gate driver 50 responds by transmitting the plurality of first light emission control signals and the plurality of second light emission controls through the plurality of second gate control lines.

Figure 2:
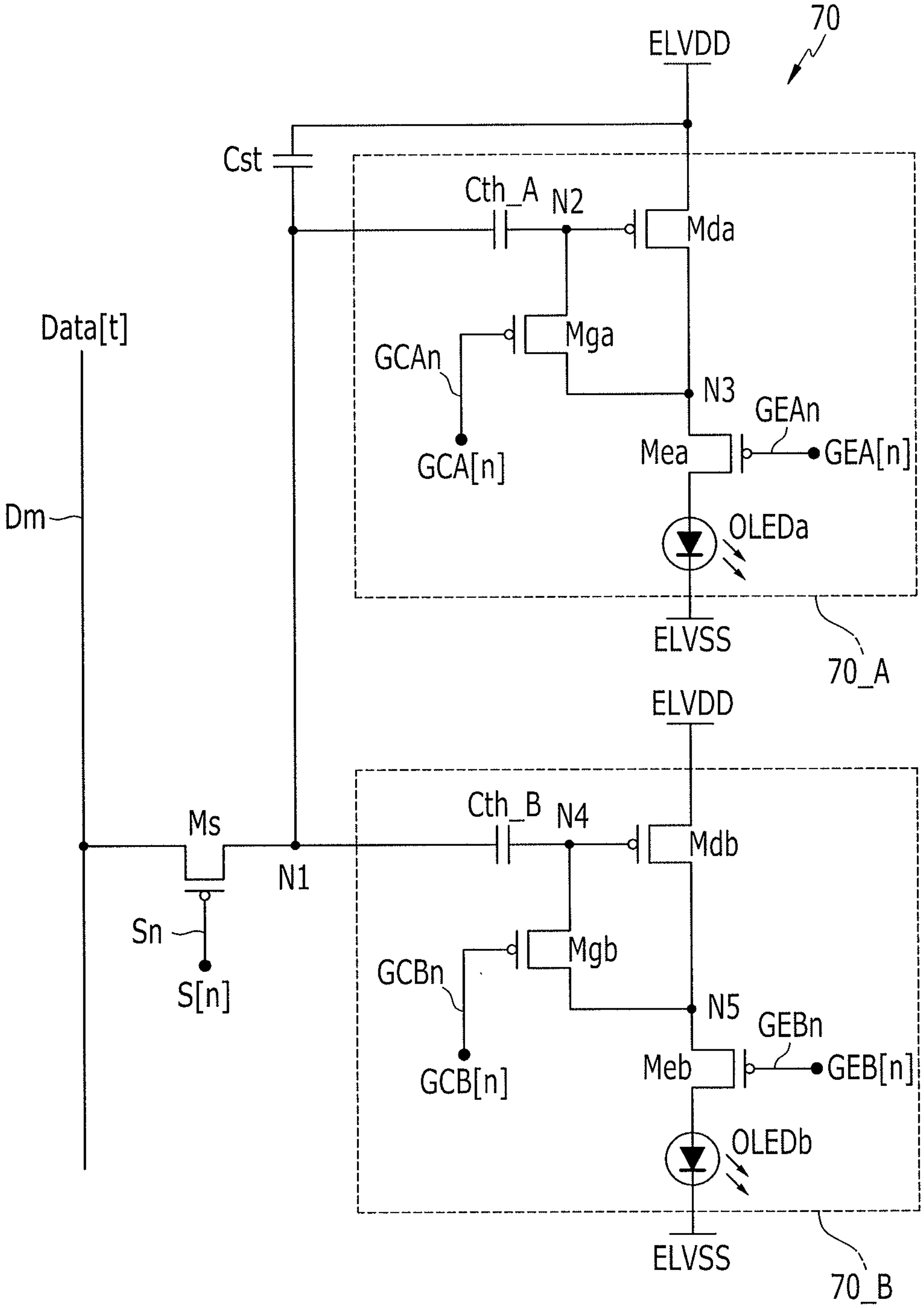
FIG. 2 illustrates an embodiment of a pixel.

FIG. 2 illustrates an embodiment of pixel 70 in the display unit of FIG. 1. Referring to FIG. 2, the pixel 70 is shown to be a pixel that corresponds to the m-th column in the n-th pixel line, and is connected with the m-th data line Dm and the n-th scan line Sn.

The pixel 70 includes a first pixel area 70_A and a second pixel area 70_B. The first pixel area 70_A is connected with the n-th first threshold voltage control line GCAn and the n-th first light emission control line GEAn. The second pixel area 70_B of the pixel 70 is connected with the n-th second threshold voltage control line GCBn and the n-th second light emission control line GEBn.

The pixel 70 further includes 7 PMOS transistors, 3 capacitors, and two organic light emitting diodes. The type of the transistor forming the pixel is a PMOS transistor, but may be another type of transistor (e.g., an NMOS transistor) in other embodiments.

The pixel 70 a first pixel area 70_A and a second pixel area 70_B share one switching transistor Ms and one storage capacitor Cst. In one embodiment, the first pixel area 70_A and the second pixel area 70_B are respectively formed of 3 transistors, one capacitor, and one organic light emitting diode.

In pixel 70, the switching transistor Ms may include a gate electrode connected to the n-th scan line Sn, a source electrode connected to the m-th data line Dm, and a drain electrode connected to a node N1. The switching transistor Ms turns on according to the corresponding scan signal transmitted to the n-th scan line Sn (Thus, the n-th scan signal S[n]) and activates the pixel. Then, a data voltage according to the corresponding image data signal Data[t] is applied to the pixel 70 through the m-th data line Dm in the corresponding frame. The data voltage according to the image data signal Data[t] is transmitted to the node N1 through the switching transistor Ms.

The node N1 is commonly connected with the first pixel area 70_A, the second pixel area 70_B, and a first electrode of the storage capacitor Cst.

A second electrode of the storage capacitor is connected to a wire that supplies a first power source voltage (ELVDD) having a predetermined high potential to each pixel. Since the storage capacitor Cst stores a voltage that corresponds to a voltage difference between voltages applied to lateral electrodes thereof, the storage capacitor Cst may maintain the voltage applied to the node N1 for a predetermined time period.

The first pixel are 70_A connected to the node N1 includes a first driving transistor Mda, a first compensation transistor Mga, a first light emission control transistor Mea, a first compensation capacitor Cth_A, and a first organic light emitting diode OLEDa.

The first driving transistor Mda includes a gate electrode connected to a node N2, a source electrode connected to a wire supplying the first power source voltage ELVDD having the predetermined high potential, and a drain electrode connected to a node N3. The first driving transistor Mda is turned on and thus forms a current path toward the first organic light emitting diode OLEDa, and transmits a driving current of a data voltage according to the corresponding image data signal to the corresponding pixel.

The first compensation transistor Mga includes a gate electrode connected with the n-th first threshold voltage control line GCAn, a first electrode connected to the node N2 to which the gate electrode of the first driving transistor Mda is connected, and a second electrode connected to the node N3 to which the drain electrode of the first driving transistor Mda. The first compensation transistor Mga is turned on by the n-th first threshold voltage control signal GCA[n] transmitted through the n-th first threshold voltage control line GCAn and compensates the threshold voltage of the first driving transistor Mda by diode-connecting the gate electrode and the drain electrode of the first driving transistor Mda.

The compensation capacitor Cth_A includes a first electrode connected to the node N1 and a second electrode connected to the node N2. The compensation capacitor Cth_A stores and maintains a voltage according to a difference between voltages applied to the lateral electrodes thereof. Thus, when the first compensation transistor Mga is turned on and the first driving transistor Mda is diode-connected, the compensation capacitor Cth_A compensates the threshold voltage of the first driving transistor Mda by maintaining the voltage of the node N3 transmitted to the node N2 for a predetermined time period.

The first light emission control transistor Mea includes a gate electrode connected to the n-th first light emission control line GEAn, a source electrode connected to the node N3, and a drain electrode connected to the first organic light emitting diode OLEDa. The first light emission control transistor Mea is turned on by the n-th first light emission control signal GEAn transmitted through the n-th first light emission control line GEAn, and controls the first organic light emitting diode OLEDa to emit light according to the driving current by opening a driving current path provided between the first driving transistor Mda and the first organic light emitting diode OLEDa.

The first organic light emitting diode OLEDa includes an anode connected to the drain electrode of the first light emission control transistor Mea and a cathode connected to a wire transmitting a power source voltage ELVSS having a predetermined low potential. The first organic light emitting diode OLEDa emits light with luminance corresponding to the driving current that depends on an image data signal Data[t] corresponding to the corresponding pixel through the current path connected with the first driving transistor Mda to thereby display an image.

The second pixel area 70_B connected to the node N1 includes a second driving transistor Mdb, a second compensation transistor Mgb, a second light emission control transistor Meb, a second compensation capacitor Cth_B, and a second organic light emitting diode OLEDb.

The second driving transistor Mdb includes a gate electrode connected to a node N4, a source electrode connected to the wire supplying the first power source voltage ELVDD having the predetermined high potential, and a drain electrode connected to a node N5. The second driving transistor Mdb is turned on and thus forms a current path toward the second organic light emitting diode OLEDb, and transmits a driving current of a data voltage according to the corresponding image data signal to the pixel.

The second compensation transistor Mgb includes a gate electrode connected to the n-th first threshold voltage control line GCBn, a first electrode connected to the node N4 to which the gate electrode of the second driving transistor Mdb is connected, and a second electrode connected to the node N5 to which the drain electrode of the second driving transistor Mdb is connected. The second compensation transistor Mgb is turned on by the n-th second threshold voltage control signal GCB[n] transmitted through the n-th second threshold voltage control line GCBn and compensates a threshold voltage of the second driving transistor Mdb by diode-connecting the gate electrode and the drain electrode of the second driving transistor Mdb.

The compensation capacitor Cth_B includes a first electrode connected to the node N1 and a second electrode connected to the node N4. The compensation capacitor Cth_B stores and maintains a voltage according to a difference between voltages applied to the lateral electrodes thereof. Therefore, when the second compensation transistor Mgb is turned on and thus the second driving transistor Mdb is diode-connected, the compensation capacitor Cth_B compensates the threshold voltage of the second driving transistor Mdb by maintaining a voltage of the node N5 transmitted to the node N4 for a predetermined time period.

The second light emission control transistor Meb includes a gate electrode connected to the n-th second light emission control line GEBn, a source electrode connected to the node N5, and a drain electrode connected to the second organic light emitting diode OLEDb. The second light emission control transistor Meb is turned on by the n-th second light emission control signal GEBn transmitted through the n-th second light emission control line GEBn, and controls the second organic light emitting diode OLEDb to emit light according to a driving current by opening a driving current path between the second driving transistor Mdb and the second organic light emitting diode OLEDb.

The second organic light emitting diode OLEDb includes an anode connected to the drain electrode of the second light emission control transistor Meb and a cathode connected to the wire transmitting the power source voltage ELVSS of the predetermined low potential. The second organic light emitting diode OLEDb emits light with luminance corresponding to the driving current that depends on the corresponding image data signal Data[t] to the corresponding pixel through the current path connected with the second driving transistor Mdb.

As described above, each pixel of the display unit 10 includes two pixel areas, each including a driving transistor generating and transmitting a driving current according to an image data signal while sharing one switch transistor, a compensation transistor compensating a threshold voltage, a light emission control transistor controlling light emission, and an organic light emitting diode which is a light emission element emitting light according to the driving current.

In the exemplary embodiment of FIG. 2, the driving transistors Mda and Mdb may have the same size W/L, or may have different sizes. Also, the compensation transistors Mga and Mdb and the light emission control transistors Med and Meb may have the same size W/L or may have different sizes.

According to another exemplary embodiment, the first pixel area 70_A and the second pixel area 70_B may be connected one organic light emitting diode and commonly use the organic light emitting diode.

Figure 6:
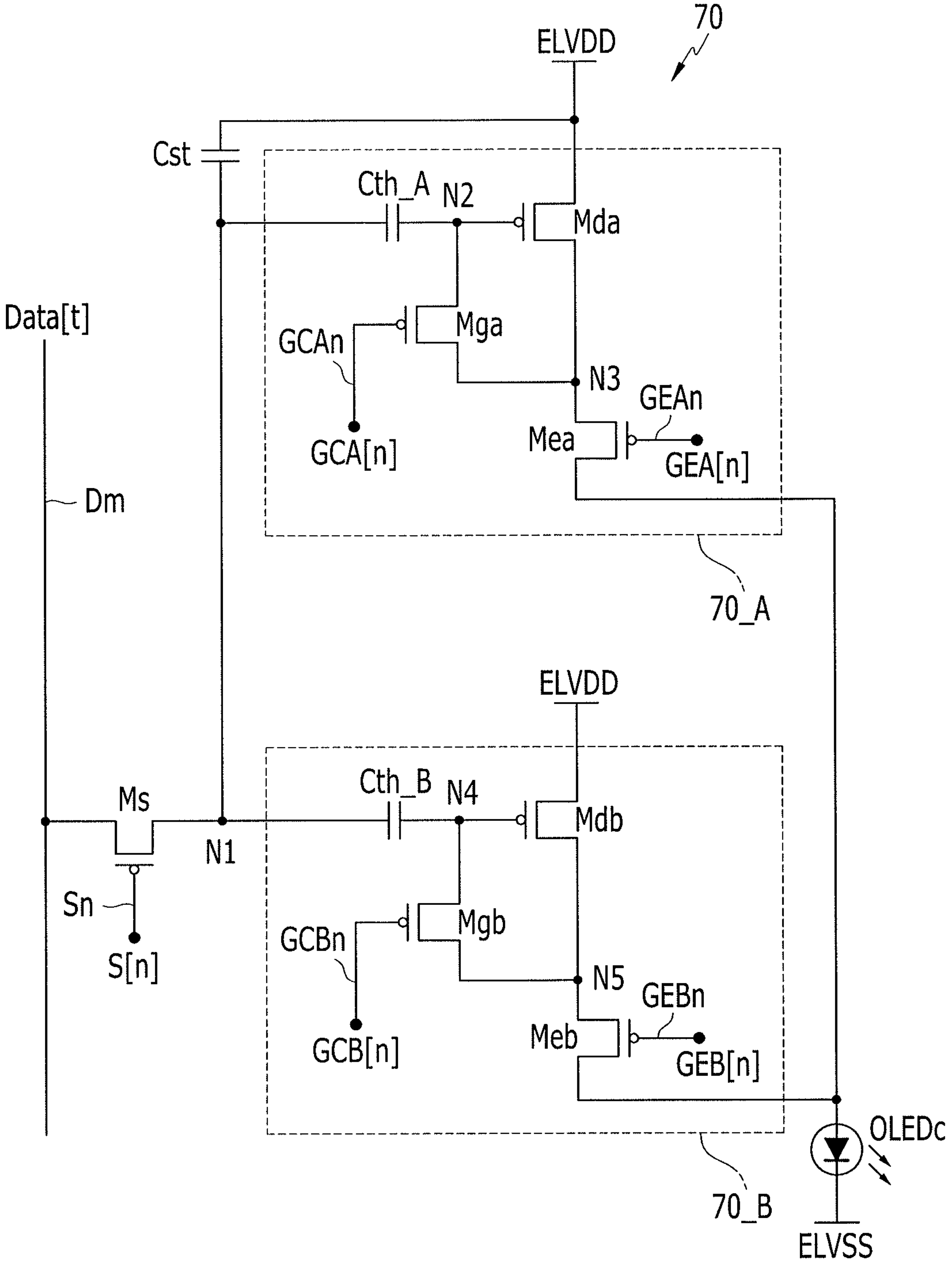
FIG. 6 illustrates another embodiment of a pixel.

FIG. 6 illustrates another embodiment of pixel 70 in the display unit of FIG. 1.

Referring to FIG. 6, a third organic light emitting diode OLEDc is connected to the first pixel area 70_A and the second pixel area 70_B. The third organic light emitting diode OLEDc emits light with luminance corresponding to the driving current, which depends on the corresponding image data signal Data[t], to the corresponding pixel through the current paths connected to the first driving transistor Mda and the second driving transistor Mdb.

As described, each pixel is divided into two pixel areas, where each pixel area is provided with circuit elements such as driving transistors and an organic light emitting diode. Thus, a compensation point of a threshold voltage of a driving transistor included in each pixel area may be set to be different from each other to generate an image according to an image data signal. Thus, a threshold voltage compensation point of the first driving transistor of the first pixel area 70_A and a threshold voltage compensation point of the second driving transistor of the second pixel area 70_B are controlled to be optimized or to achieve a predetermined performance in different gray scale values, to thereby uniformly improve luminance uniformity in realization of image in the entire display unit.

Moreover, when the pixel 70 is divided into the first pixel area 70_A and the second pixel area 70_B according to the exemplary embodiment of FIG. 2, the threshold voltage compensation points of the driving transistors depend on a timing of a threshold voltage control signal applied to each pixel area, for improving luminance uniformity.

Figure 3:
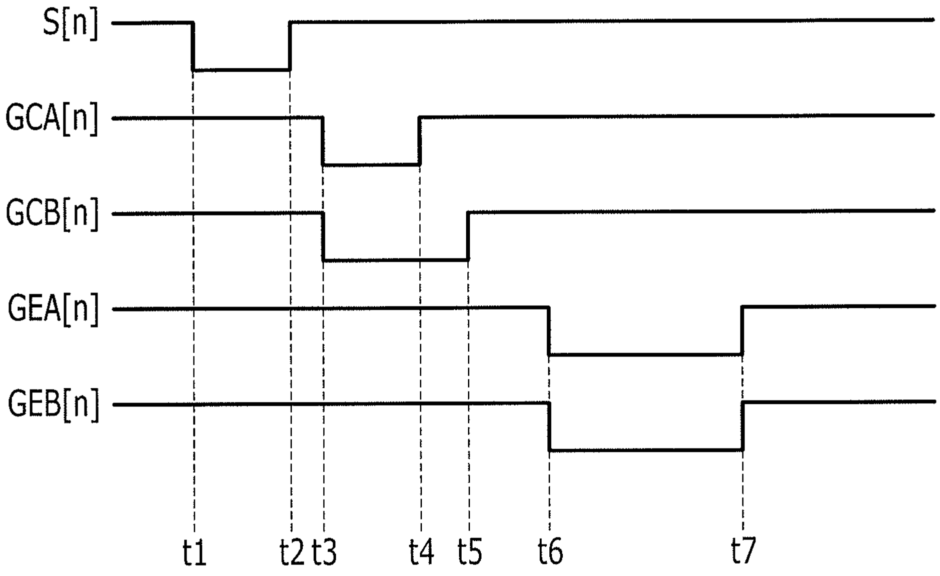
FIG. 3 illustrates an example of a timing diagram for driving the pixel of FIG. 2.

A driving process of the pixel will be described in further detail with reference to a timing diagram of FIG. 3. More specifically, FIG. 3 illustrates an example of a timing diagram according to a driving process of the pixel 70 having the two pixel areas as shown in FIG. 2.

First, the n-th scan signal S[n] is transmitted as a pulse voltage of a gate-on voltage level to a gate electrode of the switching transistor Ms of the pixel 70 during a period from t1 to t2. Since the transistor forming the pixel is a PMOS transistor in the exemplary embodiment of FIG. 2, a gate-on voltage level that turns on the transistor is a predetermined low level. Thus, when the n-th scan signal S[n] is applied as a low-level pulse voltage during the period from t1 to t2, the switching transistor Ms transmits a data voltage according to the image data signal Data[t] to the node N1. The data voltage is applied to the first electrode of the storage capacitor Cst, and the storage capacitor Cst stores a voltage according to a difference between the data voltage and the high-potential first power source voltage.

At a time t3, a low-level n-th first threshold voltage control signal GCA[n] is transmitted to the gate electrode of the first compensation transistor Mga of the first pixel area 70_A. At the same time t3, a low-level n-th second threshold voltage control signal GCB[n] is transmitted to the gate electrode of the second compensation transistor Mgb.

At a time t4, the n-th first threshold voltage control signal GCA[n] is increased to high level.

At a time t5, the n-th second threshold voltage control signal GCB[n] is increased to high level.

Then, the first compensation transistor Mga of the first pixel area 70_A is in the turn-on state during a period from t3 to t4, and the second compensation transistor Mgb of the second pixel are 70_B is in the turn-on state during a period t3 to t5.

Thus, since the first compensation transistor Mga and the second compensation transistor Mgb have different turn-on periods, threshold voltage compensation periods of the first pixel area 70_A and the second pixel area 70_B in the pixel 70 are set to be different from each other.

When the first compensation transistor Mga is turned on and thus the gate electrode and the drain electrode of the first driving transistor Mda are diode-connected during the period t3 to t4, the sum (ELVDD+Vtha) of a threshold voltage Vtha of the first driving transistor Mda and the high-potential first power source voltage is applied to the node N2 through the node N2. Then, the first compensation capacitor Cth_A maintains a gate electrode voltage of the first driving transistor Mda with a voltage to which the threshold voltage Vtha of the first driving transistor Mda is reflected.

Luminance of light emission of the first organic light emitting diode OLEDa of the first pixel area 70_A corresponds to a driving current, and the driving current Ioleda can be given as shown in Equation 1.

$$Ioleda=\frac{1}{2}*\beta*(Vgsa-Vtha)^2 \quad (1)$$

In Equation 1, β denotes mobility, Vgsa denotes a gate-source voltage of the first driving transistor Mda, and Vtha denotes a threshold voltage of the first driving transistor Mda.

Referring to Equation 1, due to the threshold voltage Vtha reflected to the voltage of the gate electrode of the first driving transistor Mda, the threshold voltage Vtha component of the first driving transistors Mda that significantly affects the amount of driving current is eliminated.

As described, in each of the plurality of pixels forming the display unit, the effect of the threshold voltage component of the driving transistor included in the first pixel area may be eliminated with respect to the amount of driving current transmitted to the first organic light emitting diode of the first pixel area, so that an electric characteristic deviation of the driving transistor may be minimized.

Such a threshold voltage compensation principle may be equally applied to the second pixel area 70_B. Thus, when the second compensation transistor Mgb of the second pixel area 70_B is turned on during a period from t3 to t5, the gate electrode and the drain electrode of the second driving transistor Mdb are diode-connected and the sum (ELVDD+Vthb) of the threshold voltage Vthb of the second driving transistor Mdb and the high-potential first power source voltage ELVDD is applied to the node N4 through the node N5. Then, the second compensation capacitor Cth_B maintains a gate electrode voltage of the second driving transistor Mdb with a voltage to which the threshold voltage Vthb of the second driving transistor Mdb is reflected.

In such a state, the amount of driving current Ioledb transmitted to the second organic light emitting diode OLEDb of the second pixel area 70_B can be given as shown in Equation 2.

$$Ioledb=\frac{1}{2}*\beta*(Vgsb-Vthb)^2 \quad (2)$$

In Equation 2, β denotes mobility, Vgsb denotes a gate-source voltage of the second driving transistor Mdb, and Vthb denotes a threshold voltage of the second driving transistor Mdb.

Due to the threshold voltage Vthb reflected to the voltage of the gate electrode of the second driving transistor Mdb, the threshold voltage Vtha component of the second driving transistors Mdb that significantly affects the amount of driving current is eliminated.

Thus, in each of the plurality of pixels forming the display unit, the effect of the threshold voltage component of the driving transistor included in the second pixel area may be eliminated with respect to the amount of driving current transmitted to the second organic light emitting diode of the second pixel area, so that an electric characteristic deviation of the driving transistor may be minimized.

Referring to FIG. 3, the threshold voltage compensation period of the first pixel area 70_A is the period from t3 to t4, and the threshold voltage compensation period of the second pixel area 70_B is the period from t3 to t5. The compensation period of the second pixel area 70_B is longer than that of the first pixel area 70_A. Thus, the turn-on period of the second compensation transistor Mgb of the second pixel area 70_B is longer than the turn-on period of the first compensation transistor Mga. As a result, a diode-connection time of the gate-drain of the second driving transistor Mdb becomes longer than a diode-connection time of the first driving transistor Mda.

Because the diode-connection time of the driving transistor is increased, a threshold voltage is determined to be a voltage in a lower driving current area, that is, a low gray scale area. On the contrary, as the diode-connection time of the driving transistor is decreased as in the first pixel area 70_A, the threshold voltage is determined to be a voltage in a higher driving current area, that is, an intermediate gray scale area.

Next, when the light emission control signal applied to the gate electrode of the light emission control transistor of each pixel area is transmitted as a low-level gate-on voltage during a period from t6 to t7, the light emission control transistor is turned on.

When a low-level first light emission control signal GEA[n] is transmitted to the gate electrode of the first light emission control transistor Mea of the first pixel area, the first light emission control transistor Mea is turned on. Thus, a driving current is transmitted to the first organic light emitting diode OLEDa of the first pixel are 70_A through a channel of the first light emission control transistor Mea. Thus, the organic light emitting diode OLEDa emits light such that an image is displayed.

When a low-level second light emission control signal GEB[n] is transmitted to the gate electrode of the second light emission control transistor Meb of the second pixel area during the same period (i.e., the period from t6 to t7), the second light emission control transistor Meb is turned on. Thus, a driving current is transmitted to the first organic light emitting diode OLEDa of the second pixel are 70_B through a channel of the second light emission control transistor Meb. Thus, the organic light emitting diode OLEDb emits light such that an image is displayed.

In the timing diagram of FIG. 3, the organic light emitting diodes of the first pixel area 70_A and the second pixel area 70_B simultaneously emit light during a period from t6 to t7 to display an image, but it is an example of a case that an image is displayed with luminance of an area higher than the intermediate gray scale value.

Therefore, when an image data signal according to an externally input image source has luminance in a predetermined low gray scale area, an image may be displayed by driving only the second pixel area 70_B having a threshold voltage compensation point in the low gray area. Thus, a pulse voltage of the second light emission control signal GEB[n] that turns on the second light emission control transistor Meb may be transmitted as low level, and a pulse voltage of the first light emission control signal GEA[n] that turns on the first light emission control transistor Mes of the first pixel area 70_A may be transmitted as high level.

Then, a current path to the organic light emitting diode is blocked in the first pixel area 70_A so that no light emitted therefrom, and the second organic light emitting diode of the second pixel area 70_B emits light with luminance of the low gray scale area to display an image.

As described, each pixel includes two pixel areas, where each area has a compensation point of a threshold voltage of a driving transistor. As a result, the threshold voltage may be smoothly compensated according to a gray scale area of an input image, and particularly, the mura phenomenon in a low gray area may be improved.

A dual compensation principle of a threshold voltage according to an exemplary embodiment will be described with reference to FIG. 4. The graph of FIG. 4 shows current characteristic curves with respect to two different pixels 1 and 2, each having a different threshold voltage characteristic of a driving transistor.

Figure 4:
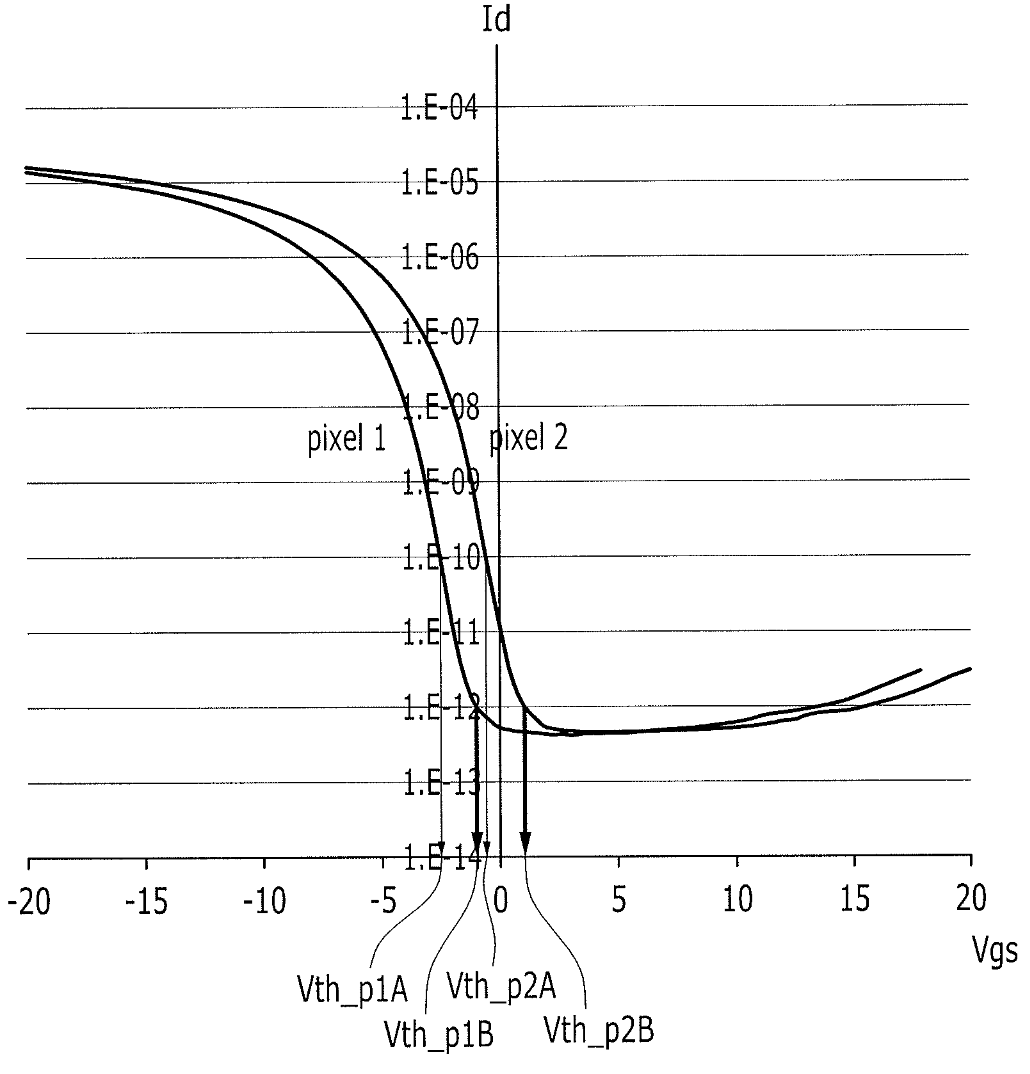
FIG. 4 is a graph illustrating an embodiment of a threshold voltage compensation principle.

Referring to FIG. 4, the current characteristic curve shows a relationship between a gate-source voltage Vgs of the driving transistor and the amount of driving current Id generated in the driving transistor and transmitted to an organic light emitting diode.

According to the exemplary embodiment, the two pixels 1 and 2 of FIG. 4 respectively include first pixel areas and second pixel areas, and diode-connect driving transistors during different compensation periods to compensate threshold voltages of the driving transistors with two compensation transistors.

As shown in the driving timing of FIG. 3, when a compensation period of a second pixel area 70_B is longer than a compensation period of a first pixel area 70_A in each pixel, a threshold voltage of the driving transistor corresponding to the first pixel area becomes Vth_p1A and a threshold voltage of the driving transistor corresponding to the second pixel area becomes Vth_p1B in the first pixel 1 of FIG. 4. In the second pixel 2, a threshold voltage of the driving transistor corresponding to the first pixel area becomes Vth_p2A and a threshold voltage of the driving transistor corresponding to the second pixel area becomes Vth_p2B.

Since a diode-connection period of the driving transistor of the second pixel area is longer than a diode-connection period of the driving transistor of the first pixel area in each pixel, a threshold voltage is determined in a lower driving current. Thus, as shown in FIG. 4, the threshold voltages Vth_p1A and Vth_p2A of the driving transistors corresponding to the first pixel area are determined in a level of 1E-10 ($1\times10^{-10}$), and the threshold voltages Vth_p1B and Vth_p2B of the driving transistors corresponding to the second pixel area are determined in a lower driving area, Thus, a low gray area of a level of 1E-12 ($1\times10^{-12}$).

Thus, the threshold voltage compensation points are determined in driving current areas of two different levels in one pixel. Therefore, a luminance deviation for each pixel may be eliminated in a low gray scale area and a gray scale area higher than an intermediate gray area.

Figure 5:
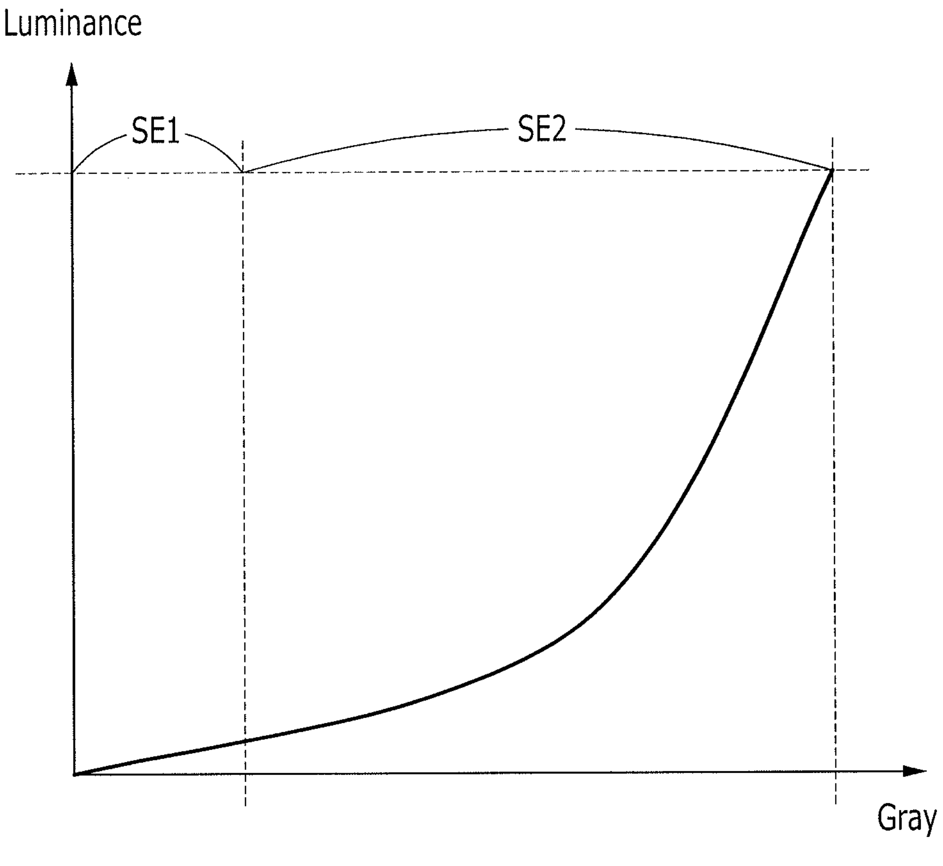
FIG. 5 is a graph illustrating an example of an operation section of a driving transistor for each gray scale value of a pixel of the display device.

FIG. 5 is a graph illustrating an embodiment of an operation period of the driving transistor for each gray in the pixel of the display device. The graph of FIG. 5 shows a relationship between a gray scale value and luminance. In FIG. 5, the gray area includes a low gray area SE1 and an intermediate gray area SE2. A range of the low gray area SE1 may be set from 0 to a predetermined gray scale value, and the intermediate gray area SE2 may be set to an area excluding the low gray area SE1.

According to the exemplary embodiment, one pixel includes two pixel areas for realizing dual threshold voltages of the driving transistors, and diode-connection times of the gate-drain electrodes of the driving transistors of the respective pixel areas are set to be different from each other.

When a gray scale value displayed by an input image data signal corresponds to the low gray area SE1 of FIG. 5, only the second pixel area 70_B among the two pixel areas in the pixel is driven. Thus, since the second pixel area 70_B has a threshold voltage compensation point of a low gray area by increasing the diode-connection time (i.e., threshold voltage compensation time) to be relatively longer than that of first pixel area 70_A, an image may be realized with high quality in a low gray area.

The second organic light emitting diode should emit light with a predetermined luminance by driving only the second pixel area 70_B in the low gray area SE1. Therefore, a pulse voltage of the first light emission control signal GEA[n] is transmitted as high level to the first light emission control transistor of the first pixel area 70_A during the period from t6 to t7 in the timing diagram of FIG. 3, to thereby prevent the first organic light emitting diode of the first pixel area 70_A from emitting light.

In this case, a pulse voltage of the second light emission control signal GEB[n] is transmitted as low level to the second light emission control transistor of the second pixel area 70_B. Thus, the second organic light emitting diode of the second pixel area 70_B emits light of a low gray area by emitting light through the second light emission control transistor.

Meanwhile, in FIG. 5, when a gray scale value of an image data signal input to the display device corresponds to the intermediate gray area SE2, an image is displayed by driving both of the two pixels areas, that is, the first pixel area 70_A and the second pixel area 70_B included in each pixel according to an exemplary embodiment.

Thus, as shown in the timing diagram of FIG. 3, a pulse voltage of the first light emission control signal GEA[n] and a pulse voltage of the second light emission control signal GEB[n] are transmitted as low level respectively to the first light emission control transistor of the first pixel area 70_A and the second light emission control transistor of the second pixel area 70_B during the period from t6 to t7.

Then, the first organic light emitting diode of the first pixel area 70_A and the second organic light emitting diode of the second pixel area 70_B emit light corresponding to the intermediate gray area according to the image data signal respectively through the first light emission control transistor and the second light emission control transistor to display an image.

By way of summation and review, the OLED has a plurality of pixels, each including a driving transistor that supplies current to an organic light emitting diode. However, a threshold voltage of the driving transistor has only one compensation point. Therefore, a mura characteristic for each gray scale value may be changed depending on where the compensation point of the threshold voltage exists. In particular, the mura phenomenon may not be improved in a low gray scale value due to a difference in compensation point of a threshold voltage of each pixel. In addition, since only one threshold voltage compensation point exists in each pixel, improvement in luminance deterioration of each pixel may be limited.

According to one or more embodiments, a light emission control transistor is provided. The light emission control transistor receives a light emission control signal and controls a light emission operation of an organic light emission diode in each pixel of a plurality of pixels in a display unit. One of multiple pixel areas of a pixel may be selectively driven or all the pixel areas may be driven through switching control of the light emission control transistor. As a result, a mura phenomenon may be evenly solved throughout the gray scale areas in a displayed image.

In other embodiments, the light emission operation of the organic light emitting diode may be controlled using a driving power source voltage applied through a power supply wire in each pixel area of the pixel. Thus, in the pixel circuit structure of FIG. 2, the light emission control transistors Mea and Meb may be omitted in the first and second pixel areas 70_A and 70_B, and light emission in the first and second pixel areas 70_A and 70_B may be controlled by controlling supply of driving power source voltages.

For example, a predetermined high-potential power source voltage ELVDD and a low-potential power source voltage ELVSS may be supplied to power supply wires respectively connected to the first pixel area 70_A and the second pixel area 70_B are controlled. The power source voltages ELVDD and ELVSS may be set in a controller of the display device or may be controlled by a power supply that supplies a power voltage.

Hence, only the second organic light emitting diode OLEDb may be controlled to emit light (low gray area SE1) or both of the first organic light emitting diode OLEDa and the second organic light emitting diode OLEDb may be controlled to emit light (intermediate gray area SE2) by controlling the flow of a driving current to the first organic light emitting diode OLEDa included in the first pixel area 70_A and the second organic light emitting diode OLEDb included in the second pixel area 70_B.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A pixel, comprising:

a switching transistor to be turned on by a scan signal and to transmit a data voltage according to an applied image data signal through a data line, a storage capacitor to store the data voltage, and first and second pixel areas commonly connected to the switching transistor and the storage capacitor to emit light with a driving current according to the data voltage, each of the first and second pixel areas including:

an organic light emitting diode to emit light, a first transistor to generate and transmit a driving current according to the data voltage through a path that reaches a second power source from a first power source via the organic light emitting diode, a second transistor to diode-connect a gate electrode and a drain electrode of the first transistor, and a compensation capacitor connected between the gate electrode of the first transistor and the switching transistor, the compensation capacitor to maintain a voltage corresponding to a threshold voltage of the first transistor for a predetermined period.

2. The pixel as claimed in claim 1, wherein a turn-on period of the second transistor of the first pixel area for threshold voltage compensation of the first transistor of the first pixel area is different from a turn-on period of the second transistor of the second pixel area for threshold voltage compensation of the first transistor of the second pixel area.

3. The pixel as claimed in claim 2, wherein, when a gray scale value of the image data signal is included in a predetermined low gray area, an image is displayed by driving the second pixel area having a longer turn-on period of the second transistor.

4. The pixel as claimed in claim 1, wherein each of the first pixel area and the second pixel area further includes a third transistor provided in the path that reaches the corresponding organic light emitting diode from the first power source, the third transistor to control light emission of the corresponding organic light emitting diode by controlling flow of the driving current that depends on the data voltage.

5. The pixel as claimed in claim 1, wherein:

the first pixel area controls a light emission operation by controlling a power voltage supply of the first power source and the second power source supplied to the first pixel area, and the second pixel area controls a light emission operation by controlling the power voltage supply of the first power source and the second power source supplied to the second pixel area.

6. A display device, comprising:

a display unit including a plurality of pixels to display an image according to an image data signal;

a scan driver to generate corresponding scan signals and sequentially transmit the scan signals through a plurality of scan lines respectively connected to the plurality of pixels;

a data driver to transmit a data voltage according to the corresponding image data signal through a plurality of data lines respectively connected to the plurality of pixels;

a first gate driver to generate a first threshold voltage control signal and a second threshold voltage control signal corresponding to each of the plurality of pixels, and to transmit the first and second threshold voltage control signals to the plurality of pixels respectively through a first plurality of gate lines and a plurality of second gate lines respectively connected to the pixels; and a controller to transmit the image data signal to the data driver and to generate and transmit a plurality of driving control signals for controlling operation of the scan driver, the data driver, and the first gate driver, wherein each of the plurality of pixels includes:

a switching transistor to receive the corresponding scan signal and transmitting a data voltage that depends on the corresponding image data signal, a storage capacitor to store the data voltage for a predetermined period, a first pixel area to receive the first threshold voltage control signal from the first gate line, and a second pixel area to receive the second threshold voltage control signal from the second gate line, at least one of the first or second pixel areas to emit light with a driving current according to the data voltage, wherein the first threshold voltage control signal is to perform threshold voltage compensation in the first pixel area for a first period and the second threshold voltage control signal is to perform threshold voltage compensation in the second pixel area for a second period different from the first period, wherein the first and second pixel areas are commonly connected to the switching transistor and the storage capacitor.

7. The display device as claimed in claim 6, further comprising:

a second gate driver to generate and transmit first light emission control signals through a plurality of third gate lines and second light emission control signals through a plurality of fourth gate lines, respectively, connected to the plurality of pixels.

8. The display device as claimed in claim 7, wherein:

the first pixel area is to receive the first light emission control signal from the third gate line, and the second pixel area is to receive the second light emission control signal from the fourth gate line, wherein light emission of the first pixel area and the second pixel area is controlled corresponding to the first light emission control signal and the second light emission control signal.

9. The display device as claimed in claim 6, wherein each of the plurality of pixels further includes:

an organic light emitting diode to emit light, a driving transistor to generate a driving current according to the data voltage and to transmit the driving current to the organic light emitting diode, a compensation transistor to diode-connect a gate electrode and a drain electrode of the driving transistor to compensate a threshold voltage of the driving transistor, and a compensation capacitor to maintain a voltage corresponding to the threshold voltage of the driving transistor for a predetermined period.

10. The display device as claimed in claim 9, wherein each of the first pixel area and the second pixel area further includes a light emission control transistor to control light emission by controlling flow of the driving current transmitted to the organic light emitting diode from the driving transistor.

11. The display device as claimed in claim 9, wherein a turn-on period of the compensation transistor of the first pixel area corresponding to the first threshold voltage control signal is different from a turn-on period of the compensation transistor of the second pixel area corresponding to the second threshold voltage control signal.

12. The display device as claimed in claim 11, wherein:

when a gray scale value of the image data signal is included in a predetermined low gray area, the second pixel area having a longer turn-on period of the compensation transistor is driven to display an image.

13. The display device as claimed in claim 6, wherein:

the first threshold voltage control signal and the second threshold voltage control signal are transmitted as a gate-on voltage level at substantially a same time, the first threshold voltage control signal is transmitted as the gate-on voltage level in the first period, and is the second threshold voltage control signal is transmitted as the gate-on voltage level in the second period which is different from the first period.

14. The display device as claimed in claim 6, wherein:

the controller controls light emission of each of the first pixel area and the second pixel area by controlling a driving power source voltage supplied to the first pixel area and a driving power source voltage supplied to the second pixel area.

15. A pixel for a display device, the pixel comprising:

a first pixel area to control light emission;

a second pixel area to control light emission; and a switching transistor coupled between a data line and the first and second pixel areas, wherein the first pixel area includes a first threshold compensation period and the second pixel area includes a second threshold compensation period different from the first threshold compensation period, and wherein the first threshold compensation period has a transistor turn-on period different from a transistor turn-on period of the second threshold compensation period, at least one of the first pixel area or the second pixel area including an organic light emitting diode, wherein the second pixel area controls emission of light during a time when the first pixel area is deactivated.

16. The pixel as claimed in claim 15, wherein:

the first pixel area is to emit light based on a first threshold voltage control signal corresponding to the transistor turn-on period of the first threshold voltage compensation period, and the second pixel area is to emit light based on a second threshold voltage control signal corresponding to the transistor turn-on period of the second threshold voltage compensation period.

17. The pixel as claimed in claim 15, wherein:

the first pixel area includes a first organic light emitting diode, and the second pixel area includes a second organic light emitting diode.

18. The pixel as claimed in claim 17, wherein:

the first organic light emitting diode is to emit light based on a first light emission control signal, the second organic light emitting diode is to emit light based on a second light emission control signal, the second organic light emitting diode emitting light during a first state in which the first organic light emitting diode does not emit light, and the first and second organic light emitting diodes emitting light during a second state, the first state corresponding to a first range of gray scale values and the second state corresponding to a second range of gray scale values.

19. The pixel as claimed in claim 15, wherein the first pixel area and the second pixel area commonly use one organic light emitting diode.

* * * * *